United States Patent [19]
Anderson et al.

[11] Patent Number: 5,412,536
[45] Date of Patent: May 2, 1995

[54] LOCAL CONDENSATION CONTROL FOR LIQUID IMPINGEMENT TWO-PHASE COOLING

[75] Inventors: Timothy M. Anderson; Gregory M. Chrysler; Richard C. Chu; Robert E. Simons, all of Poughkeepsie, N.Y.

[73] Assignee: International Business Machines Corporation, Armonk, N.Y.

[21] Appl. No.: 218,534

[22] Filed: Mar. 28, 1994

[51] Int. Cl.⁶ .............................................. H05T 7/20
[52] U.S. Cl. .................................. 361/700; 165/80.5; 165/104.26; 174/15.2; 257/715
[58] Field of Search ................ 165/80.4, 80.5, 104.33, 165/104.26, 185; 174/15.1, 15.2, 16.3; 257/714, 715; 361/689, 699, 700-703

[56] References Cited

U.S. PATENT DOCUMENTS

| | | | |
|---|---|---|---|
| 4,880,053 | 11/1989 | Vladimir | 165/104.26 |
| 4,928,207 | 5/1990 | Chrysler et al. | 361/700 |

FOREIGN PATENT DOCUMENTS

0498753  8/1992  European Pat. Off. ............ 361/689

*Primary Examiner*—Gregory D. Thompson
*Attorney, Agent, or Firm*—Lily Neff; Larry Cutter

[57] ABSTRACT

Cooling module geometry provides a method for controlling local condensation for liquid impingement two-phase cooling of electrical and/or electronic circuit chips. The method and apparatus described herein uses vapor condensation in the exhaust flow from each chip site within a multi-chip module which utilizes direct liquid impingement with phase change.

9 Claims, 7 Drawing Sheets

LOCAL CONDENSATION CONTROL FOR LIQUID IMPINGEMENT TWO-PHASE COOLING

FIELD OF THE INVENTION

This invention relates to an improved cooling system for high density integrated circuits, and more particularly an improved method of local vapor condensation and void-fraction control for direct liquid impingement cooling with phase change. More generically, the cooling system of the present invention operates with the high heat transfer characteristics of a two-phase cooling system, but with the more desirable flow characteristics of a single phase system.

BACKGROUND OF THE INVENTION

As integrated circuits become more complex, the circuit density of the chips increases. One square centimeter chips can contain millions of separate electronic components. Increased heat removal demands have been an on-going problem. Traditional cooling methods for thermal control such as forced gas and liquid convection have been replaced by direct liquid impingement boiling heat transfer. Liquid impingement with phase-change at a heated chip surface offers the promise of providing chip cooling capability in excess of 100 W/cm$^2$.

The means of providing liquid impingement on the chip is often in the form of single or multiple liquid jets, or in the form of a liquid spray with many small droplets. With many chips packaged closely together and operating at high heat fluxes the vapor generated mixes with the exhaust liquid creating a two-phase mixture of liquid and vapor. As the void fraction or the ratio of local vapor volume to total local flow volume increases, instabilities tend to result in disruptions in coolant flow to the chip. Similarly, if the vapor in the exhaust liquid is not condensed before returning to the pump the flow delivery capability of the pump will be degraded and the pump could suffer physical damage.

OTHER PATENTS RELATING TO THE FIELD OF INVENTION

U.S. Pat. No. 4,847,731 seems to describe a pool boiling scheme with no liquid flow into or out of the module.

U.S. Pat. No. 4,862,321 appears to teach a cooling system for a hot body by evaporation of liquid refrigerant to prevent crucial warming of a coolant prior to contact with a heat dissipating element.

U.S. Pat. No. 4,614,227 seems to have only a moderate cooling capacity due to the lack of dependence on coolant phase change.

U.S. Pat. No. 4,897,762 appears to be a method of cooling electronic circuitry by the use of fluid spray in conjunction with air. The method uses some "air jet curtain" to contain coolant flow. There is no mention of a secondary coolant, and the method does not seem to use local condensation to minimize cooling hardware volume.

U.S. Pat. No. 4,912,600 seems to utilize a non-local condensation approach. Furthermore FIG. 1 shows the condensation device positioned distant from the cooling package and FIG. 2 shows inlet flow to be liquid while the outlet flow to be vapor. There is no use of a secondary coolant.

U.S. Pat. No. 4,956,746 appears to have no dependence on phase change in coolant and due to its method of single phase cooling which therefore has only moderate cooling capacity.

U.S. Pat. No. 5,021,924 seems to teach a method of cooling with moderate performance parallel flow forced convection. The method seems to have no dependence on phase change in coolant, and does not mention use of a secondary coolant.

SUMMARY OF THE INVENTION

Accordingly, an object of the present invention is to provide a method of local condensation control for direct impingement, two-phase cooling without any disruptions in the coolant flow to the chip. To avoid any instabilities in the coolant flow volume, the void fraction or the ratio of local vapor volume to total local flow is to be controlled.

Another object of the present invention is to provide more effective means for cooling high density integrated circuits.

Still another object of the present invention is the construction of a two-phase cooling system which has the flow characteristics of a single phase system.

Yet another object of the present invention is to permit faster operation of digital systems including computers by virtue of more effective cooling for the high density integrated circuits that faster computer systems require.

A still further object of the invention is increased circuit reliability obtained by operating a high heat flux chip device at a temperature lower than a non-two-phase process would allow.

To achieve the above-mentioned objects, a condenser structure is placed in a location close to the chip. Fins are provided on the top of the condenser structure and on the thermally active bottom side of a supply plenum. The space between the top of the condenser plate and the bottom of the coolant supply plenum serves as an exhaust plenum for the module. A coolant fluid is introduced into the supply plenum at a temperature close to but below its saturation point. Apertures are provided in the condenser structure to allow the liquid flow nozzle to project through the plate to the chip surface. When the liquid contacts the chips, it evaporates and the resulting fluid enters a return passage surrounding each nozzle which is connected to the exhaust plenum. While passing through the exhaust plenum, the fluid is then condensed back to liquid form. In this fashion the coolant is in a vapor phase essentially only in that part of the flow path proximal to the chip site.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 2 is a pair of graphs illustrating heat flow and coolant state along a primary coolant flow path associated with a single chip site, and particularly FIG. 2A shows the heat flow direction into and out of the coolant, while

DETAILED DESCRIPTION OF THE INVENTION

Figure 1:
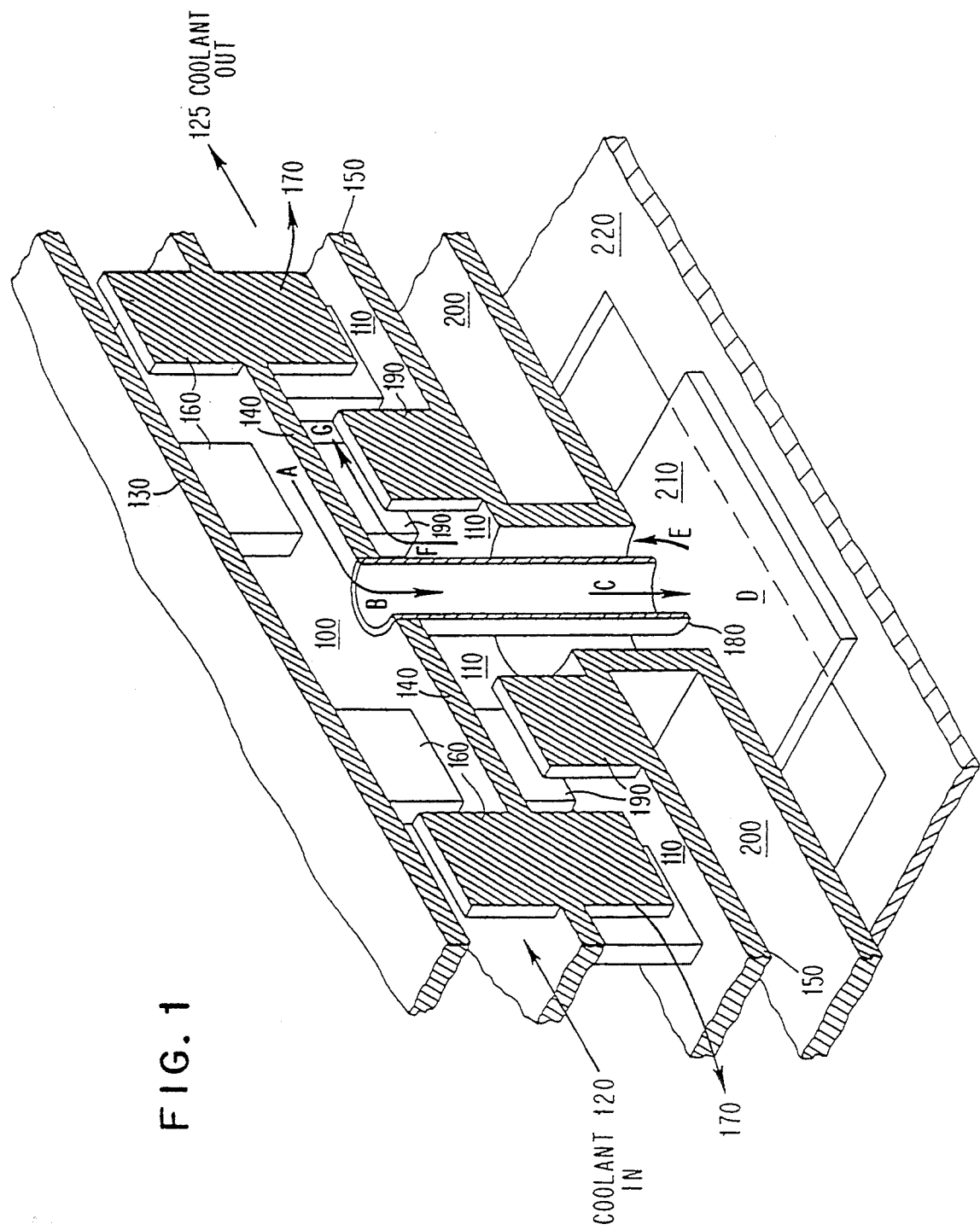
FIG. 1 is an isometric, partially cut-away view of an embodiment of the present invention illustrating a single integrated circuit chip being cooled by local evaporation with condensation control.

The desired local condensation cooled high density package configuration for high density electronic circuit chips shown in FIG. 1 comprises supply plenum 100 and return or exhaust plenum 110 for primary coolant 120. These plenums are formed by a sandwich structure of outer housing 130, separating plate 140, and internal condenser structure 150. Separator plate 140 has extended surfaces 160 with fins that project upwardly into supply plenum 100 and surfaces also with fins 170 that project downwardly into exhaust plenum 110.

Additionally, separating plate 140 indicates primary coolant nozzle 180 that projects through return plenum 110 and condenser structure 150. Condenser structure 150 has externally disposed extended surfaces 190 that project into the exhaust plenum 110. Condensor structure 150 also has internal passages 200 for the secondary coolant. Chips 210 are attached to substrate 220 by solder ball connections or by any other convenient method.

In general heat generated by the electronic circuits on chips 210 is removed by a secondary coolant in condenser 150. This secondary coolant may comprise water or any other convenient heat transfer fluid. The primary coolant serves as transport media, supplying thermal energy from the surface of chips 210 to secondary coolant passing through condenser structure 150. Thus, the state of the primary coolant 125 upon leaving exhaust plenum 110 is the same as that entering supply plenum 100. Therefore there is no need for further thermal processing of the primary coolant external to module 300.

Figure 2A:
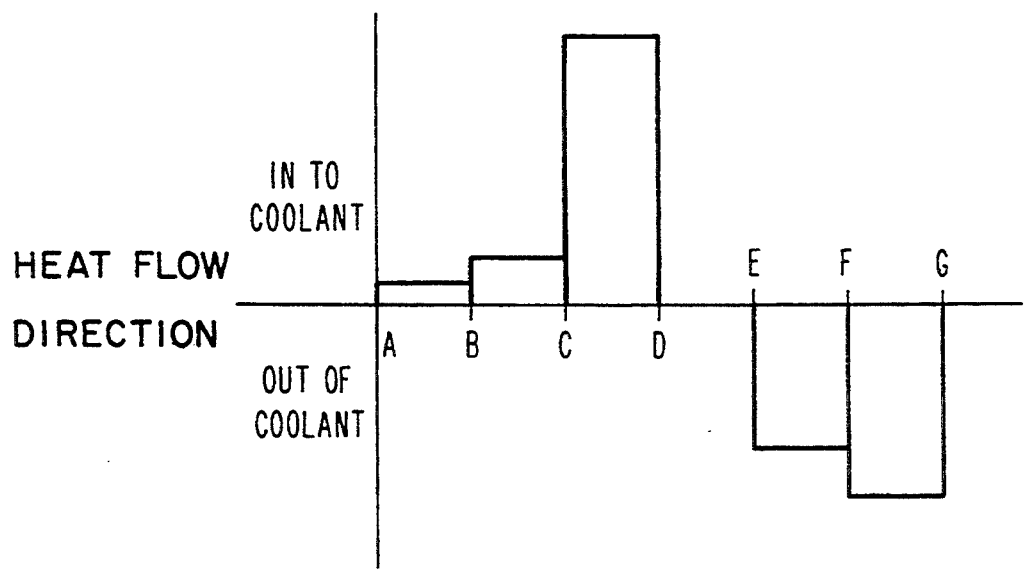
Figure 2B:
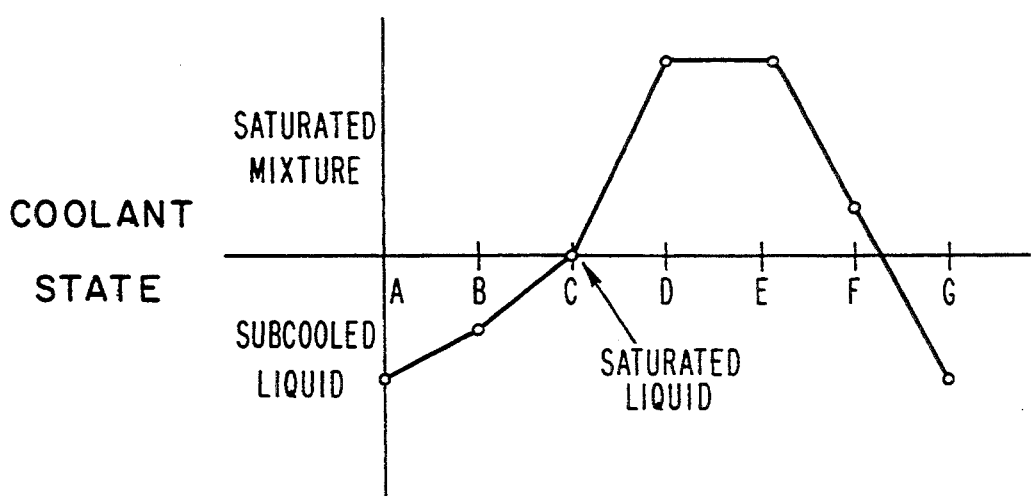
FIG. 2B illustrates the coolant state.

FIG. 2 is a graph showing heat flow and coolant state for the primary coolant from point A through point G. The primary coolant enters the module as a subcooled liquid at point A. It is heated to a nearly saturated state as it proceeds past warm upwardly extended surfaces with fins 160 protruding from the separator plate 140 on its way to the entrance of the nozzles at point B. Further heating of the coolant occurs as it passes down nozzle 180 resulting in a saturated state condition at the nozzle at point C. The primary coolant then undergoes a liquid to vapor change of state at point D on the chip surface, thus removing heat through the processes of boiling, evaporation and forced convection. Now in a vapor form at point E, the primary coolant proceeds through an annular passage defined by nozzle 180 and an opening in condenser structure 150 and thence into exhaust plenum 110. Along this plenum path, through points F and G, a majority of the heat absorbed from the chip is rejected to the secondary coolant in condenser 150 through condensation. A somewhat smaller portion of the heat is rejected to the primary coolant in supply plenum 100 through separator plate 140 and its associated fin structures 160 and 170 so as to provide the aforementioned sensible energy gain of the primary coolant flowing from A to B.

Figure 3:
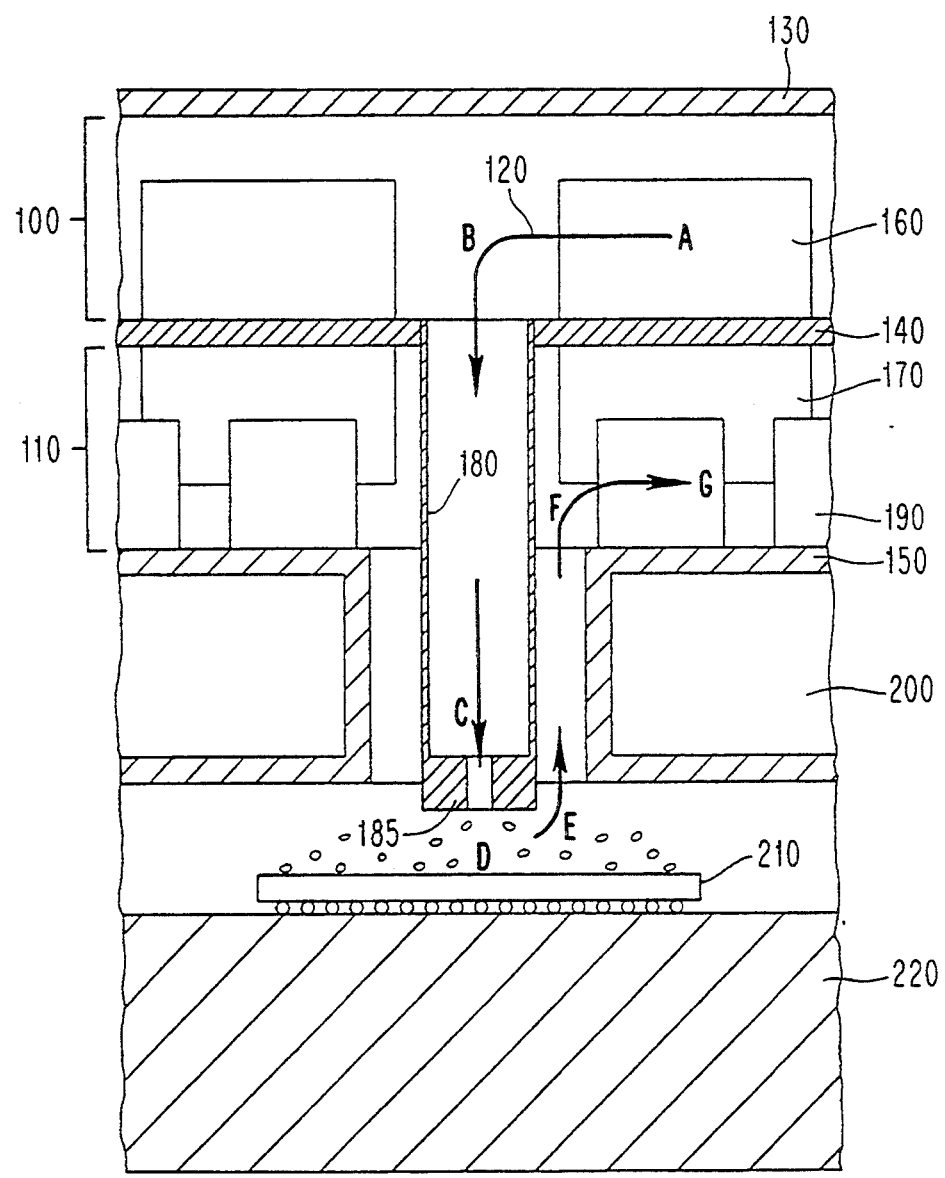
FIG. 3 is a cross-sectional, partially cut-away, side elevation view of an embodiment of the invention showing the coolant path associated with a single chip site and which is labeled so as to be particularly keyed with the coolant graphs of FIG. 2.

While the structure illustrated in FIG. 3 shows a preferred embodiment of the present invention, certain variations are also possible. For example, it is not necessary for the coolant return path to comprise an annular passage surrounding nozzle 180. It is noted in particular that it is possible to provide retrun paths through condenser 150 at the corners of each chip site. However, from a manufacturing viewpoint, if nozzle 180 passes through condenser 150, it is easier not to have a tight clearance fit between nozzle 180 and the sidewalls of the opening through condenser 150. The annular volume provides a return path to exhaust plenum 110 and renders the placement and fit of nozzle 180 more tolerant to manufacturing variations.

Additionally, while fins 190 are shown closer to nozzle 180, it is also possible to dispose fins on downwardly projected surfaces 170 closer to nozzle 180. Likewise, it is not required that fins 160 and 170 be disposed directly opposite each other on their respective sides of separator plate 140. It is also not required that fins present on all surfaces 160, 170 and 190 have rectangular cross-sections. They may be tapered at their ends to provide a smoother flow or may even have a circular cross-section to provide a larger thermally conductive footprint against the walls to which they are affixed or of which they are a part. In fact the fins shown may actually comprise any convenient heat transfer surface structure. Thus, they may be fins, pins, vanes, etc. Also, it is noted that in some embodiments, especially those involving a single chip site or the cooling of a single power transistor device, the fins may be disposed radially about the annular opening surrounding nozzle 180.

In many situations it is anticipated that outer housing 130 does not participate thermally in the cooling process. In such cases, outer housing 130 may be comprised of plastic material. Furthermore, in those situations (and not only for the chip cooling application described herein) where it is desired to make separator plate 140 thin, so as to facilitate thermal transfer between the inlet and exhaust plenums, it is possible to extend upward surfaces with fins 160 so that they are in physical contact with outer housing 130. This alternate structure helps to restore any rigidity to the overall structure that may be lost by making separator plate 140 thin.

FIG. 3 helps to correlate FIGS. 1 and 2 to one another. FIG. 3 is a partially cut-away view of an embodiment of the invention showing high density packaging of high speed integrated circuit chips cooled by local condensation. The same numbers as in FIG. 1 are used to indicate identical structures in the invention. However, points A through G as indicated in FIG. 3 are identical to points A through G as shown in FIG. 2 and indicate the heat flow and coolant state of the primary coolant. Additionally, FIG. 3 illustrates that nozzle 180 is also preferably provided with end plug 185 to control pressure and flow rates and to provide a more dispersed distribution of coolant across chip 210. Tapering of nozzle 180 may also optionally be employed to meet this objective.

Figure 4:
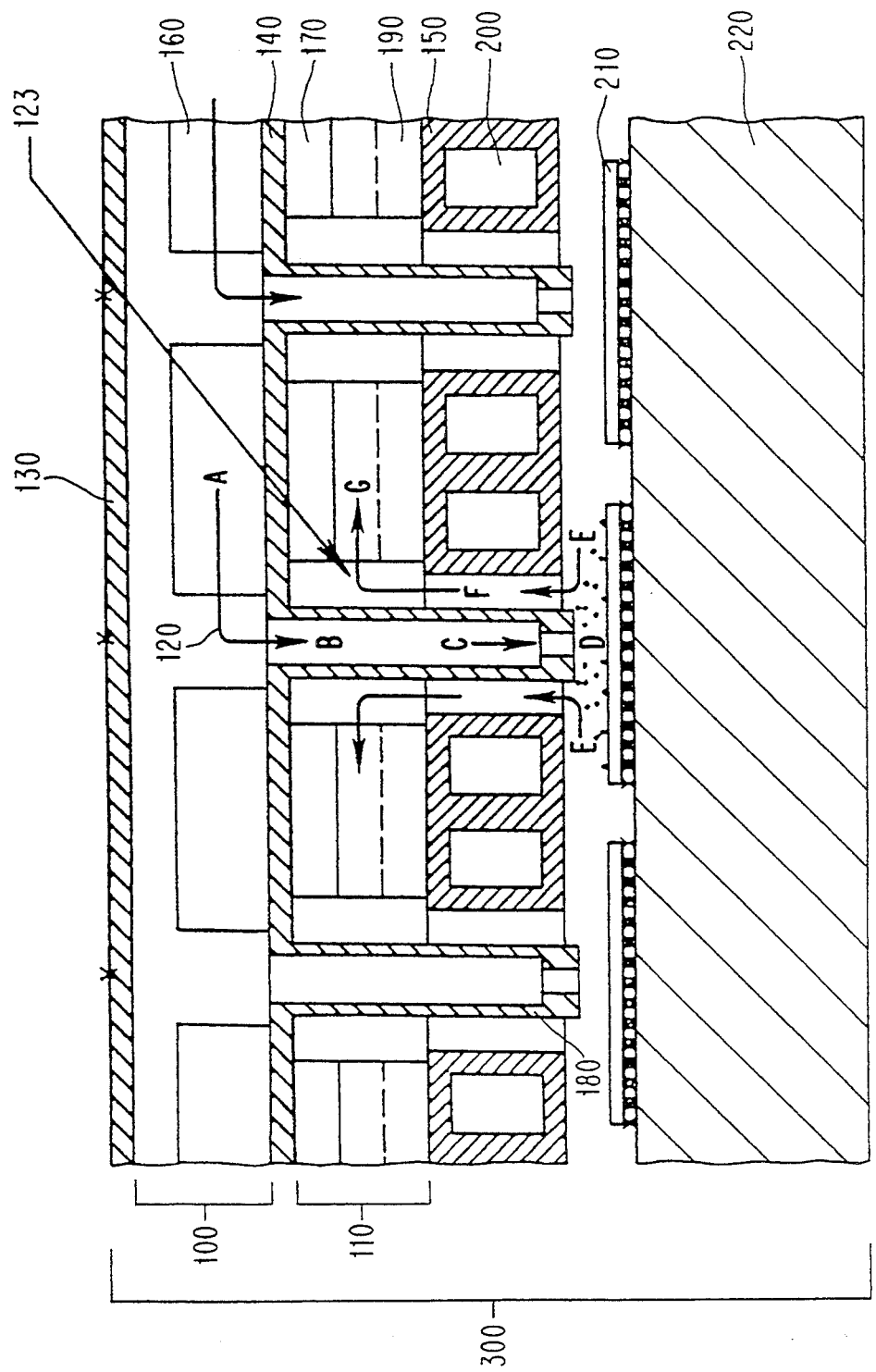
FIG. 4 is a cross-sectional, side elevation view of a module with a plurality of chips, and nozzles to directly cause impingement of coolant on each chip.

FIG. 4 is a partial cross-sectional side elevation view of a cooling module in accordance with the present invention. This figure particularly illustrates the arrangement of nozzles, inlet plenum, exhaust plenum, flow and condenser structure when it is desired to cool an array of chips.

Figure 5:
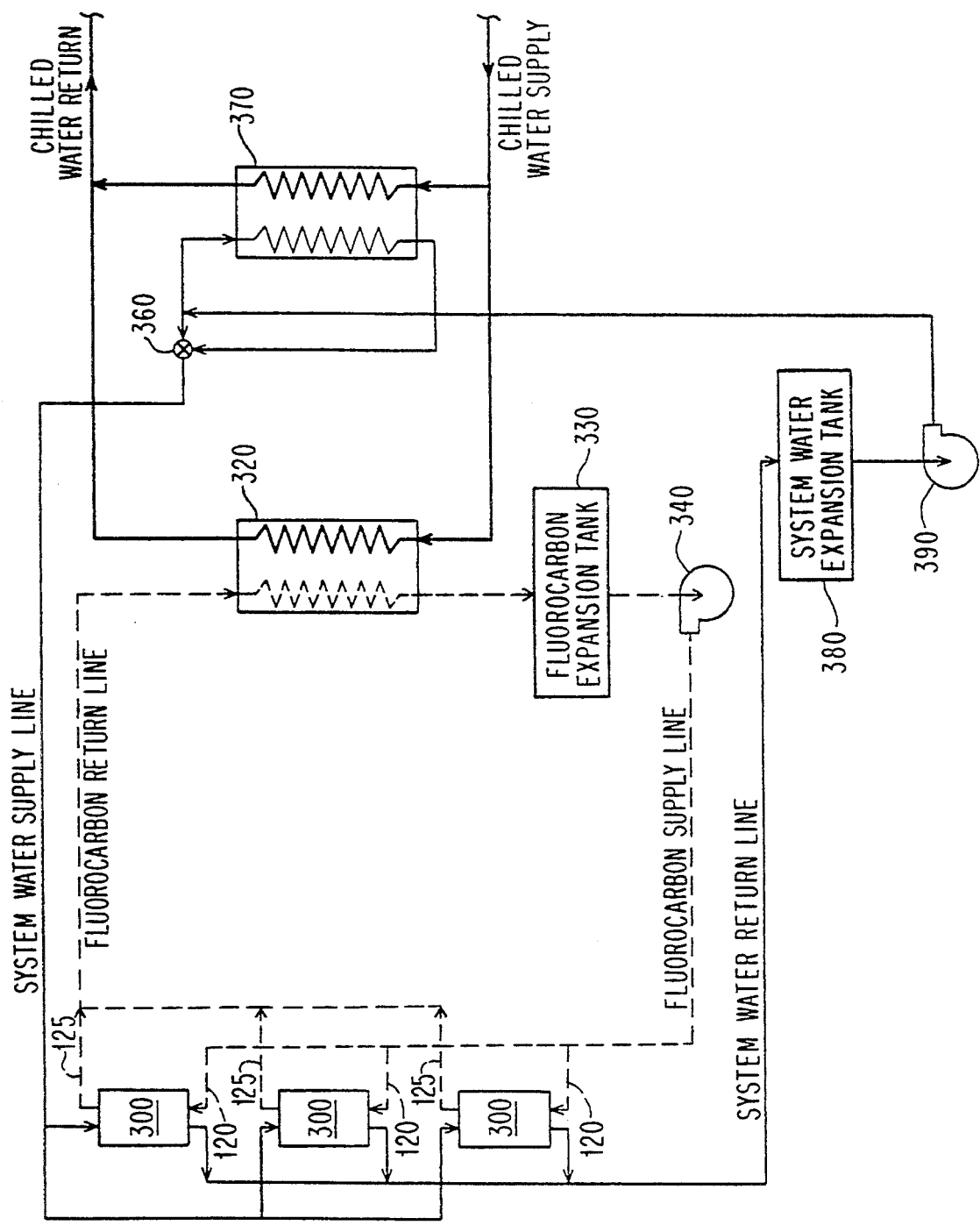
FIG. 5 is a system coolant flow schematic diagram particularly illustrating primary and secondary coolant loops.

FIG. 5 illustrates an overall system in which the present invention may be employed. In particular, FIG. 5 shows both the primary and secondary coolant loops. Primary coolant 120 is supplied to coolant inlet(s) of module(s) 300. If a plurality of modules are to be cooled they are preferably connected as shown. Exiting primary coolant 125 leaves module(s) 300 through outlet(s) and thereafter to heat exchanger 320 where heat may be rejected to secondary coolant in an external loop. Primary coolant flows to expansion tank 330 which is employed essentially as a "capacitive" buffer to assure a sufficient primary coolant supply under varying cooling load demands and conditions.

FIG. 5 also illustrates the flow of secondary coolant through module(s) 300, secondary coolant expansion tank 380, pump 390, three-way mixing valve 360, heat exchanger 370 and back again to condenser inlet(s) for module(s) 300. Heat exchanger 370 is typically connected to a customer's chilled water supply (as shown) and operates to facilitate the rejection of heat energy out of the secondary coolant loop. The customer's chilled water supply is also preferably used, when available and needed, for the purpose of cooling primary coolant in heat exchanger 320. Mixing valve 360 is used to control how much secondary coolant is diverted through heat exchanger 370 prior to its return to module(s) 300. In one valve position, no secondary coolant passes through heat exchanger 370. In an opposite position, all of the secondary coolant passes through heat exchanger 370. Intermediate positions ov valve 360 provide for generally proportionate mixing of the flow possibilities into module(s) 300.

Figure 6:
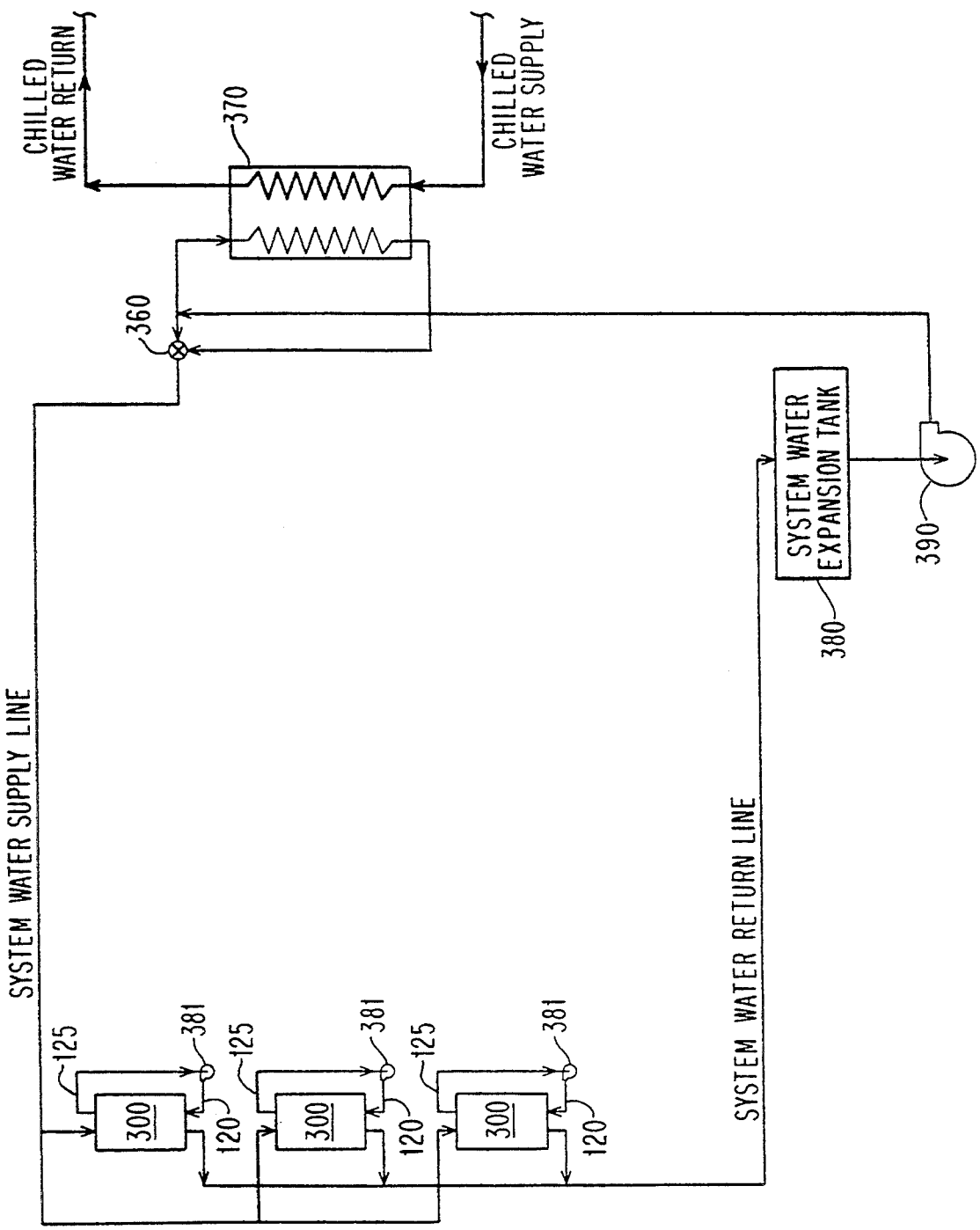
FIG. 6 is a system coolant flow schematic diagram illustrating a flow arrangement particularly well suited for retrofit applications.

A simplified cooling system, such as shown in FIG. 6, is also employable using the local condensation controlled liquid impingement principles of the present invention. The simplified system shown is particularly applicable for retro-fitting for existing water cooled systems. In this flow path configuration, each module 300 is provided with its own primary coolant pump 301 which accepts primary coolant from module outlet 125 and in turn supplies it under pressure to module inlet 120. The secondary coolant flow is the same as that shown in FIG. 5. However, in this simplified flow configuration, there is essentially no thermal transfer between the primary and secondary coolant fluids apart from transfer occurring within module(s) 300.

For those situations in which electrical equipment such as power transistors and circuit chips are to be cooled the primary coolant is a dielectric. Possible primary coolants therefore include materials such as fluorocarbons, refrigerants and the like. For these same electrical applications, the preferred secondary coolant is water. However, other usable secondary coolants include heat transfer oils, fluorocarbons, refrigerants and the like.

Figure 7:
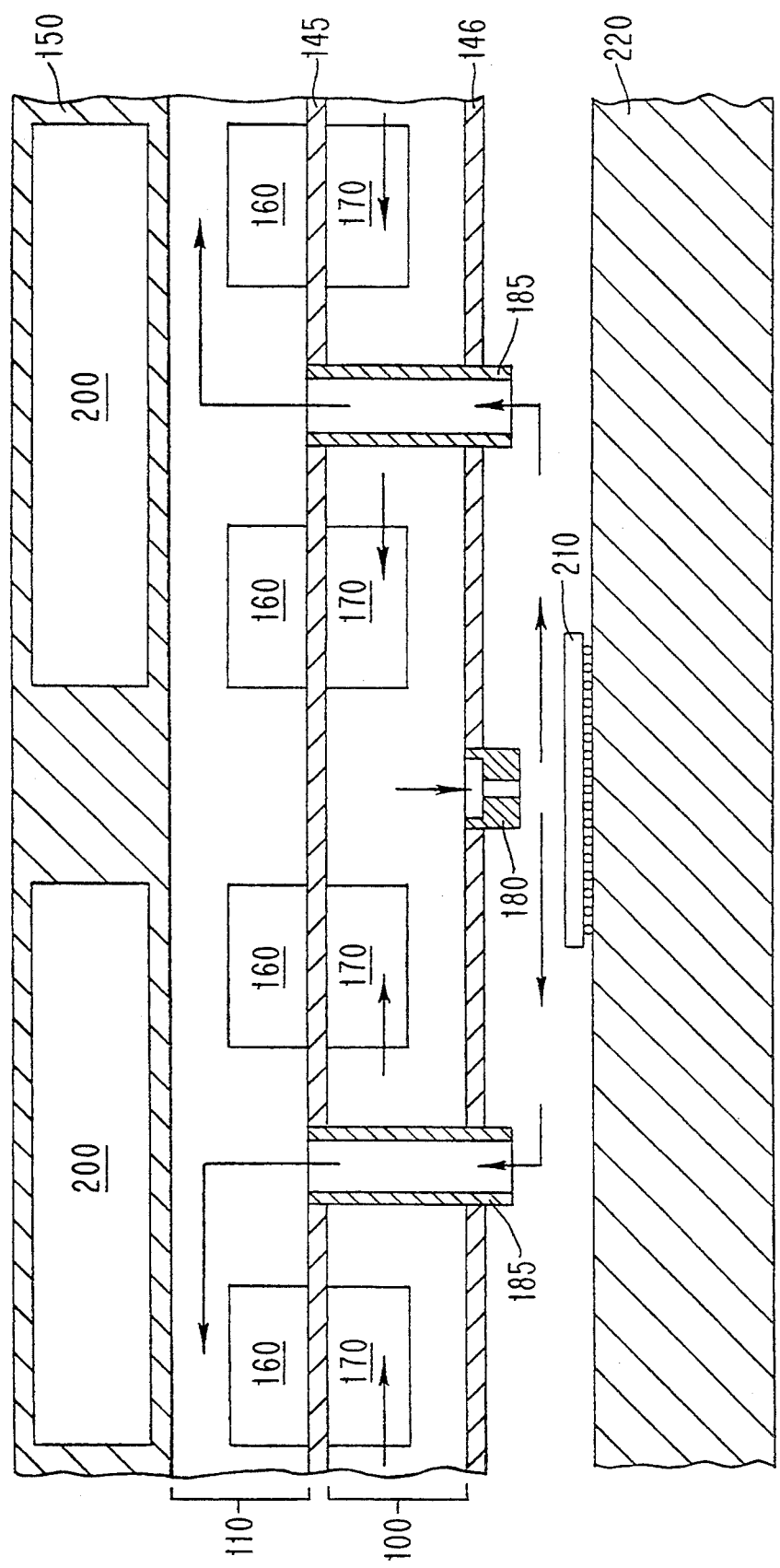
FIG. 7 is a cross-sectional, side elevation view of an alternate embodiment of the present invention in which a condenser structure is disposed in a more exterior location.

It is also noted that while FIG. 1 shows condenser 150 in its preferred location adjacent the object to be cooled, it is also possible to dispose condenser 150 in an exterior position with an input plenum disposal so as to provide an inlet flow path for the primary coolant, the path being spaced a small distance sway from the chip-/object. Such a design provides nozzle means directing coolant flow from the inlet plenum toward the chip. Additionally, fluid flow channel means would then be provided through the inlet plenum but not in fluid communication therewith. This fluid flow channel means would conduct primary coolant, heated by the chip/object from the vicinity of the chip/object to the exhaust plenum. Such an arrangement is shown in FIG. 7.

It is also noted that while the present invention is particularly directed to cooling high density integrated circuit chips for use in mainframe and supercomputer systems, the cooling system described herein is also applicable generally to systems for which local cooling is desirable and/or needed. For example, the present invention may also be used to cool high local heat flux regions requiring an inert coolant such as mirrors used in high power laser applications.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

Having thus described our invention, what we claim as new and desire to secure by Letters Patent is:

1. A cooling device for a module having a substrate with at least one electric circuit chip utilizing direct liquid impingement two-phase cooling with local condensation of vapor, said cooling device comprising:

a coolant supply plenum for receiving a first coolant;

an outer housing placed on one side of said plenum;

a separator plate placed on an opposing side of said plenum so that said plenum is disposed between said outer housing and said separating plate;

at least one heat transfer surface structure disposed upon an upper surface of said separating plate and extending into said coolant supply plenum;

a condenser structure placed on one side of said separator plate opposing said outer housing, so that said separator plate is at least partially disposed between said supply plenum and said condenser structure;

said condenser structure having at least one externally disposed surface extending into said exhaust plenum;

an exhaust plenum disposed between said separator plate and said condenser structure for receiving said first coolant liquid returning from said substrate with chip after impingement;

said condenser plate also having an internal passage for receiving a second coolant;

nozzle means disposed between said supply plenum and said chip for causing the impingement of said first coolant liquid from said supply plenum directly on said chip;

at least one coolant return passage, through said condenser, and connected to said exhaust plenum for receiving said first coolant after impingement on said chip; and at least one heat transfer surface structure disposed upon a surface of said separator plate and extending into said exhaust plenum.

2. The cooling device of claim 1, in which said second coolant is water.

3. The cooling device of claim 1, in which said first coolant liquid is sprayed on a chip by said nozzle means having an end plug therein for spray control.

4. The cooling device of claim 1, in which said first coolant liquid is impinged on said chip by said nozzle means as a continuous jet.

5. The cooling device of claim 1, in which said first coolant liquid is impinged on said chip by said nozzle means as droplets.

6. The cooling device of claim 1, in which said heat transfer surface structure extending into said supply plenum from said separator plate is disposed directly above said heat transfer surface structure which extends into said exhaust plenum from said separator plate.

7. A cooling device comprising
an input plenum for receiving a flow of a first coolant;
condenser means for directing the flow of said first coolant, connected to said input plenum on one side and to an exhaust plenum on another other side, so that said condenser means is also disposed between an object to be cooled and said exhaust plenum;
said exhaust plenum also used for receiving a flow of said first coolant;
said condenser means having an aperature therein through which nozzle means is disposed, said nozzle means connected to for directing the flow of said first coolant from said input plenum against the object to be cooled; and
passage means providing fluid communication between the vicinity of the end of said nozzle means proximal to the object and said exhaust plenum.

8. The device of claim 7, in which said coolant state control means comprises: a first heat transfer surface structure for facilitating transfer of thermal energy from said exhaust plenum into said input plenum; and second heat transfer surface structure for facilitating transfer of thermal energy from said exhaust plenum into said condenser means.

9. The device of claim 7, in which said condenser means is cooled by the flow of a second coolant therethrough.

* * * * *